United States Patent [19]

Nakagawa et al.

[11] 4,431,915
[45] Feb. 14, 1984

[54] ELECTRON BEAM APPARATUS

[75] Inventors: Seiichi Nakagawa; Yoshio Ishimori; Naoki Date, all of Akishimashi, Japan

[73] Assignee: Jeol Ltd., Tokyo, Japan

[21] Appl. No.: 323,094

[22] Filed: Nov. 19, 1981

[30] Foreign Application Priority Data

Nov. 21, 1980 [JP] Japan .................................. 55-164384

[51] Int. Cl.³ ...................... H01J 29/70; G01N 23/00
[52] U.S. Cl. .............................. 250/310; 250/356 ML
[58] Field of Search .................... 250/310, 311, 396 R, 250/396 ML; 313/361

[56] References Cited

U.S. PATENT DOCUMENTS 3,911,321 10/1975 Wardly ........................ 250/396 ML
4,330,709 5/1982 de Chambost ............... 250/396 ML

OTHER PUBLICATIONS

"Design Study of Toroidal Deflection Yokes with Eddy-Current Compensation", Wordly, *Journ. of Applied Phy.*, vol. 45, No. 5, May 1974, pp. 2310-2320.

*Primary Examiner*—Bruce C. Anderson
*Attorney, Agent, or Firm*—Webb, Burden, Robinson & Webb

[57] ABSTRACT

An upper deflection coil comprising a toroidal coil. A lower deflection coil comprising a saddle-shaped coil to minimize the combined inductance of the upper and lower deflection coils. A single scanning signal generator which supplies the deflection coils with scanning signals having different frequencies, ranging from low scanning speeds to television scanning speeds. Thus, no image shift occurs when changing scanning speeds in between television scanning speeds and other scanning speeds.

6 Claims, 4 Drawing Figures

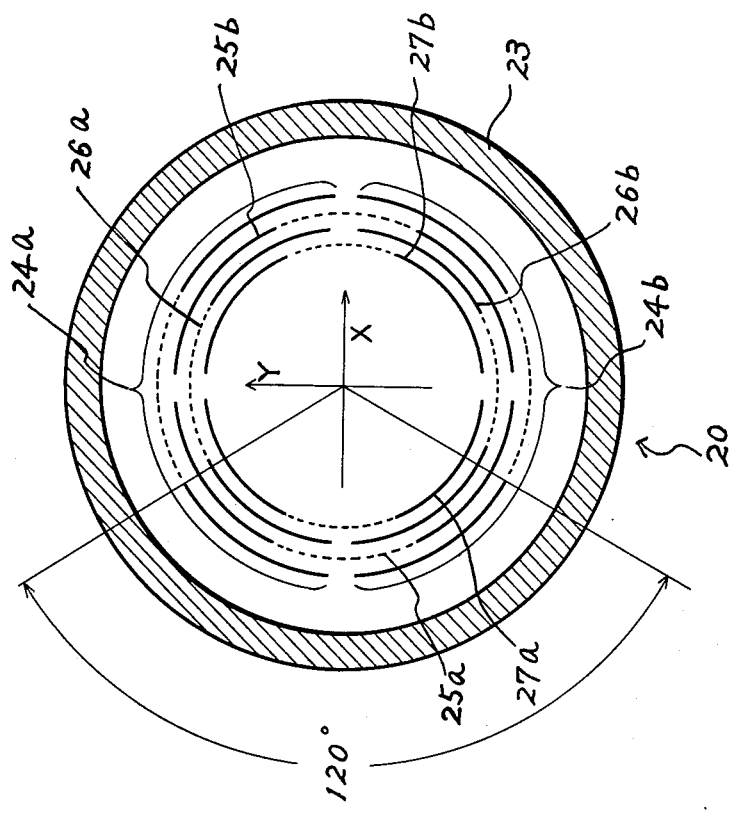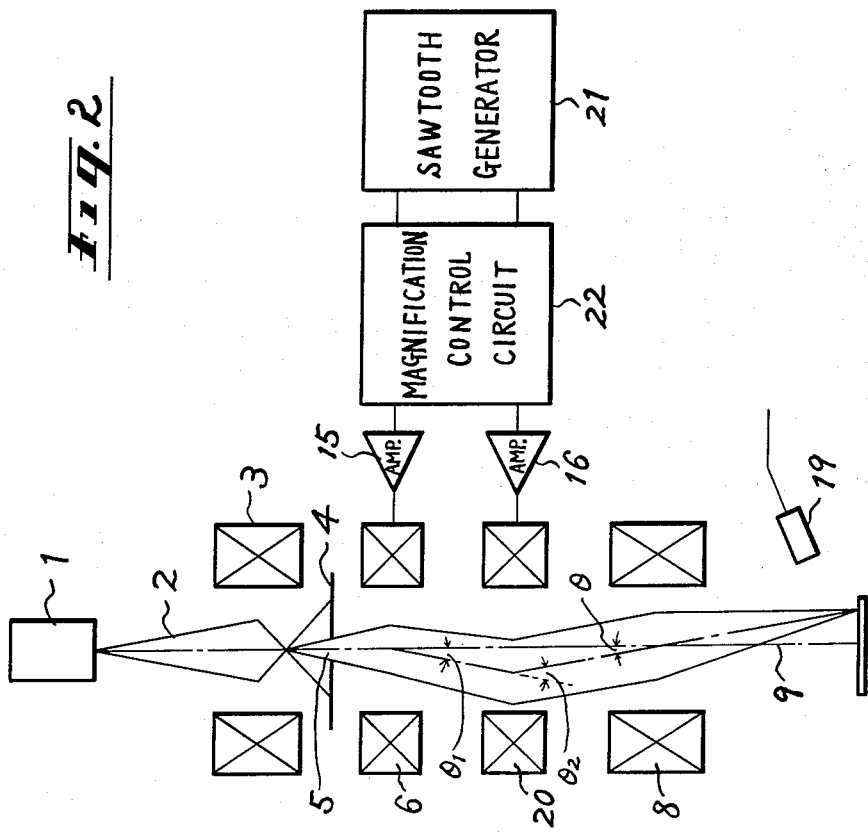

ELECTRON BEAM APPARATUS

BACKGROUND

The present invention relates to an electron beam apparatus equipped with two deflection coils located between a condenser lens and an objective lens. Designed for use on scanning electron microscopes, etc., this electron beam apparatus employs the deflection coils so as to deflect the beam and to permit scanning of the specimen surface. There has been a need to scan the specimen over a wide variety of speeds, ranging from a slow scanning speed to a television scanning speed. To meet such a requirement, the conventional electron beam apparatus illustrated in FIG. 1 was constructed.

In FIG. 1, an electron beam 2 emitted from an electron gun 1 is condensed onto an aperture plate 4 by a condenser lens 3. The electron beam that passes through an opening 5 of the plate 4 is deflected by an upper toroidal coil 6 at an angle $\theta_1$ and deflected back by a lower toroidal coil 7 at an angle $\theta_2$, and passes through the center of an objective lens 8. Thus, the electron beam 2 is deflected at a total angle of $\theta = \theta_2 - \theta_1$ with respect to an optical axis 9 before it reaches a specimen 10. A television scanning pulse generating circuit 11 produces an output signal which is supplied via a magnification control circuit 12 to terminals (a) of switches 13, 14 which are connected via amplifiers 15, 16, respectively, to the upper and lower toroidal coils 6, 7. A sawtooth generator 17 produces scanning signals having different scanning speeds ranging from a low scanning speed to the so-called super rapid scanning speed (which is slightly slower than a television scanning speed), the output signal from the sawtooth generator 17 being supplied via a magnification control circuit 18 to terminals (b) of the switches 13, 14. A secondary electron detector 19 produces a detection signal which is supplied to a cathode ray tube (not shown), which is scanned in synchronization with the scanning of the specimen by the electron beam.

When it becomes necessary to change the scanning speed of the electron beam 2 from a low scanning speed to a super rapid scanning speed in a conventional electron beam apparatus, the switches 13, 14 are connected to the terminals (b) to allow the output signal from the sawtooth generator 17 to be supplied to the upper and lower toroidal deflection coils 6, 7, and the sawtooth generator 17 is adjusted to generate scanning signals of the desired frequencies. On the other hand, for effecting scanning at a television scanning speed, the switches 13, 14 are connected to the terminals (a) to allow square-wave pulses from the pulse generator 11 to be supplied to the deflection coils 6, 7. (The square-wave pulses are distorted in waveforms by the deflection coils 6, 7 in which there actually flows current of a sawtooth waveform.)

Such switching between the scanning signal sources is necessary for the following reasons:

In general, the upper deflection coil must be small in size, since it is necessary that the upper deflection coil be located adjacent to the aperture plate. Therefore, the upper deflection coil is selected as a toroidal coil. However, in the conventional apparatus, the lower deflection coil is also selected as a toroidal coil. While toroidal coils are small in size, they have a large self-inductance (hereinafter called "inductance") per unit deflection angle. Therefore, the upper and lower toroidal deflection coils 6, 7 have a comparatively large combined inductance. Owing to the large inductance, when a current that approximates a television scanning frequency is supplied from the sawtooth generator in order to satisfy the need for high-speed scanning observation, the sawtooth waveform of the current becomes distorted while flowing through the deflection coils, resulting in poor scanning operation. Therefore, switching is necessary to allow the pulse generator 11 to supply current of a square waveform, which will be distorted into a sawtooth waveform, for television scanning. However, it is difficult to keep the zero points of the pulse generator 11 and the sawtooth generator 17 in line with each other at all times. Therefore, the specimen image shifts, in effect preventing observation of the same region of the specimen image when changing scanning speeds between television scanning speeds and other scanning speeds.

Moreover, the use of two sources of scanning signals renders the apparatus complex in structure and costly to manufacture.

SUMMARY OF THE INVENTION

An object of the present invention is to provide an electron beam apparatus free from specimen image shift when changing scanning speeds between a television scanning speed and other scanning speeds.

Another object of the present invention is to provide an electron beam apparatus that is simple in structure and capable of being manufactured at low cost.

According to this invention, an electron beam apparatus is arranged so that an upper deflection coil is comprised of a toroidal coil and a lower deflection coil is comprised of a saddle-shaped coil, with both coils being supplied by a single scanning signal generator such that the scanning signals having different frequencies ranging from slow scanning speeds to television scanning speeds.

THE DRAWINGS

The invention will now be described in further detail with reference to the accompanying schematic drawings.

FIG. 2 shows one embodiment according to the invention;

FIG. 3 shows a saddle-shaped deflection coil; and

DESCRIPTION OF THE PREFERRED EMBODIMENT

Figure 1:
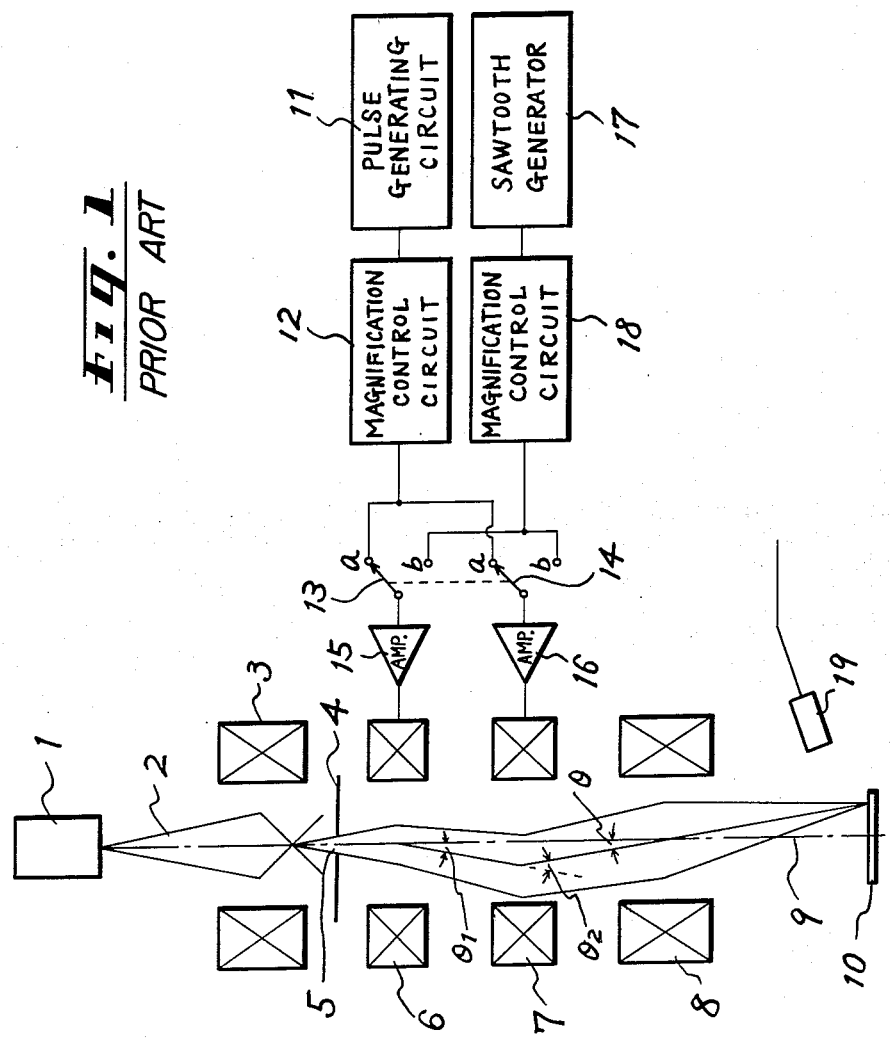
FIG. 1 shows a prior electron beam apparatus.

FIG. 2 shows on embodiment according to the invention. The apparatus shown in FIG. 2 is different from the prior apparatus illustrated in FIG. 1 in that the lower deflection coil comprises a saddle-shaped deflection coil 20 in place of a toroidal deflection coil, and the upper toroidal deflection coil 6 and the lower deflection coil 20 are supplied with scanning signals from a single sawtooth generator 21 via magnification control circuit 22. The sawtooth generator 21 produces signals of sawtooth waveforms having different frequencies corresponding to a wide variety of scanning speeds ranging from low scanning to television scanning speeds.

FIG. 3 illustrates the deflection coil 20 in detail. In the figure, 23 represents a ferrite core. Inside the core, four pairs of saddle-shaped coil elements (24a, 24b), (25a, 25b), (26a, 26b), (27a, 27b) are located in layers.

Figure 4:
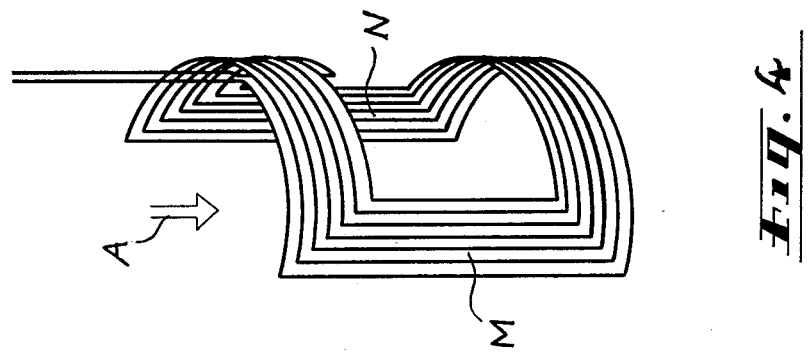
FIG. 4 shows a perspective of a saddle-shaped deflection coil.

The paired coil elements are located opposite each other in the same layer. Coil elements 24a, 24b in the first layer are for deflecting an electron beam in the X direction. One of the coil elements is shown in perspective in FIG. 4. The coil element shown in FIG. 3 is viewed in the direction of A in FIG. 4. The solid-line portion in FIG. 3 corresponds to the coil windings (indicated by M and N in FIG. 4), which directs current to flow in a direction perpendicular to the surface of the drawing. As is known, the portion of the coil elements 24a, 24b, including coil windings which direct current to flow in the same direction as that referred to above, represents 120°, as illustrated in FIG. 3, thus reducing distortion in a magnetic field generated by the coil elements 24a, 24b. The saddle-shaped coil elements 25a, 25b in the second layer for deflection in the direction Y are angularly spaced 90° from the coil elements 24a, 24b in close contact therewith. If the ratio of the distance between the coil elements 24a, 24b and the core 23 to the distance between the coil elements 25a, 25b and the core 23 is taken as 1, then the coupling between the core 23 and the coil elements 24a, 24b and coupling between the core 23 and the coil elements 25a, 25b can be regarded as equivalent. For this reason, the coil elements 24a, 24b are spaced from the core 23 by the widest distance that spatial limitations permit (for example, 1 mm). Since the said ratio cannot be 1 even when the distance between the core 23 and the coil elements 24a, 24b is wide, the angle of deflection in the direction X becomes slightly larger than the angle of deflection in the direction Y, when the same current flows through the coil elements in the first and second layers with the same number of windings. To avoid this problem, the number of windings of the coil elements 25a, 25b exceeds that of the windings of the coil elements 24a, 24b by two, for example, to equalize the angles of deflection in the directions X and Y when the same deflection currents flow through the coil elements. (Therefore, the said angle of coil elements 25a, 25b is slightly larger than 120°.) The saddle-shaped coil elements 26a, 26b in the third layer are radially disposed towards the saddle-shaped coil elements 25a, 25b so as to permit slight shifting of the electron beam in the direction X, while saddle-shaped coil elements 27a, 27b in the forth layer are radially disposed towards the coil elements 26a, 26b for slightly shifting the electron beam in the direction Y. The coil elements (26a, 26b) and (27a, 27b) are used when it becomes necessary to shift the observed area precisely. Assuming that the principal plane of the objective lens 8 and the center of the deflection field generated by the said saddle-shaped deflection coil 20 is spaced at a distance F from each other, and the center of the deflection field generated by the toroidal deflection coil 6 is spaced at a distance G from the center of the deflection field generated by the saddle-shaped deflection coil 20, the objective lens 8, the toroidal deflection coil 6 and the saddle-shaped deflection coil 20 are positioned relative to each other so that the relation $G/F \geq 3$ is established.

Generally, an angle of deflection $\theta$ and an ampere-turn $Ni$ of a deflection coil have a relation: $\theta \propto Ni$. Assuming that the upper deflection coil has a deflection angle of $\theta_1$ and the lower deflection coil has a deflection angle of $\theta_2$, the relation: $\theta_2 = (G/F+1)\theta_1$ exists. From the relations $G/F \geq 3$ and $\theta_2 = (G/F+1)\theta_1$ we derive the relation $\theta_1/\theta_2 \geq \frac{1}{4}$. Therefore, when the same deflection current flows through the upper and lower deflection coils, the number of windings $N_1$, $N_2$ of the upper and lower deflection coils exhibit the relation $N_1/N_2 \leq \frac{1}{4}$.

Since $L \propto N^2$, where $L$ is the coil inductance, $L_1/L_2 \leq 1/16$ if the upper and lower deflection coils are toroidal coils. Therefore, where the relation $G/F \geq 3$ exists, the combined inductance of the upper and lower deflection coils may be regarded as being determined solely by the inductance of the lower deflection coil. Thus, reducing the combined inductance can be achieved by reducing the inductance of the lower deflection coil. Comparison between toroidal and saddle-shaped deflection coils having cores of substantially the same radius indicates that the inductance of the saddle-shaped deflection coil required for deflecting an electron beam unit angle is about $\frac{1}{4}$ of the inductance of the toroidal deflection coil. Since the toroidal deflection coil allows increased flux leakage, which passes through a lens yoke, the inductance of the saddle-shaped deflection coil is 1/5 to 1/6 that of the toroidal deflection coil as actually mounted on the apparatus. In considering the electron beam apparatus according to the present invention, the lower deflection coil, which comprises a saddle-shaped coil, renders the combined inductance of the upper and lower deflection coils extremely small. The deflection coils 6, 20 are supplied with current of a sawtooth waveform from the single sawtooth generator 21 for scanning operation at a wide variety of speeds, ranging from a slow scanning speed to a television scanning speed. No image shifting occurs when changing the scanning speed between the television scanning speed and other scanning speeds, allowing a specimen to be observed in the same region thereof at all times.

Having a single source of scanning signals, the apparatus is simple in construction and can be manufactured at low cost.

When considering the apparatus according to the present invention, the number of windings of the saddle-shaped deflection coil elements used for deflecting an electron beam deflection in the direction X differs from the number of windings of the saddle-shaped deflection coil elements used for deflecting the electron beam in the direction Y so as to compensate for the difference between degrees of coupling between the coil elements and the core. Thus, the degree of electron beam in the direction X and Y, when the coil elements are supplied with the same current, is equalized for easy selection and control of deflection signals in rotating an image based on scanning rotation.

Having thus described the invention with the detail and particularity required by the Patent Laws, what is claimed and desired protected by Letters Patent is set forth in the following claims:

1. An electron beam apparatus comprising an electron gun for emitting an electron beam, a condenser lens for condensing the said electron beam, an objective lens for focusing the said electron beam on the specimen, upper and lower deflection coils interposed between the said condenser lens and said objective lens, the said upper deflection coil comprising a toroidal coil, the said lower deflection coil comprising a saddle-shaped coil, the said deflection coils being energized by a deflection current supplied from a single power supply which generates scanning signals having frequencies ranging from slow scanning speeds to television scanning speeds, a detection means for detecting data signals from the said specimen illuminated with the said electron beam, and the means for displaying an image of the said specimen utilizing the said signals detected by the said detection means.

2. An electron beam apparatus as set forth in claim 1, wherein F is the distance between the principal plane of the said objective lens and the center of the deflection field generated by the said saddle-shaped deflection coil, wherein G is the distance between the center of the deflection field generated by the said toroidal deflection coil and that of the deflection field generated by the said saddle-shaped deflection coil and such that $G/F \geqq 3$.

3. An electron beam apparatus as set forth in claim 1, wherein the saddle-shaped deflection coil comprises a core, and the saddle-shaped-layered coil elements are inwardly disposed in the said core.

4. An electron beam apparatus as set forth in claim 3, wherein the said saddle-shaped-layered coil elements are disposed at the greatest distance from the core, insofar as spatial limitation permits.

5. An electron beam apparatus as set forth in claim 3, wherein the said saddle-shaped-layered coil elements comprise the first and second layer coil elements for deflecting an electron beam in the X and Y directions respectively, and the third and fourth layer coil elements for slightly shifting the electron beam in the X and Y directions, respectively.

6. An electron beam apparatus as set forth in claim 3, wherein the said saddle-shaped-layered coil elements comprise the first and second layer coil elements for deflecting an electron beam in the X and Y directions, respectively; the number of windings in the second layer being just greater than in the first layer.

* * * * *